United States Patent
Kaneda et al.

(10) Patent No.: US 8,153,357 B2
(45) Date of Patent: *Apr. 10, 2012

(54) PHOTOSENSITIVE COMPOSITION REMOVER

(75) Inventors: Masato Kaneda, Shunan (JP); Yasuhiro Mikawa, Shunan (JP); Koji Shimizu, Shunan (JP); Kouichi Terao, Shunan (JP)

(73) Assignee: Showa Denko K.K., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/582,787

(22) PCT Filed: Dec. 14, 2004

(86) PCT No.: PCT/JP2004/018973
§ 371 (c)(1),
(2), (4) Date: Jun. 13, 2006

(87) PCT Pub. No.: WO2005/059646
PCT Pub. Date: Jun. 30, 2005

(65) Prior Publication Data
US 2007/0161530 A1 Jul. 12, 2007

Related U.S. Application Data

(60) Provisional application No. 60/532,715, filed on Dec. 29, 2003.

(30) Foreign Application Priority Data

Dec. 16, 2003 (JP) .................... 2003-418112

(51) Int. Cl.
*G03F 7/30* (2006.01)
*G03F 7/32* (2006.01)
*C11D 7/50* (2006.01)

(52) U.S. Cl. ......... 430/331; 430/434; 430/435; 510/175

(58) Field of Classification Search .............. 430/256, 430/331, 269, 434, 435; 510/176, 175
See application file for complete search history.

(56) References Cited

U.S. PATENT DOCUMENTS

| | | | |
|---|---|---|---|
| 4,120,810 A | 10/1978 | Palmer | |
| 4,267,260 A | 5/1981 | Miura et al. | |
| 4,822,723 A * | 4/1989 | Dhillon | 430/331 |
| 4,845,008 A * | 7/1989 | Nishioka et al. | 430/165 |
| 4,943,516 A * | 7/1990 | Kamayachi et al. | 430/280.1 |
| 5,185,235 A * | 2/1993 | Sato et al. | 430/331 |
| 5,198,482 A * | 3/1993 | Phillips et al. | 524/94 |
| 5,268,260 A * | 12/1993 | Bantu et al. | 430/325 |
| 5,276,096 A * | 1/1994 | Serdiuk et al. | 525/123 |
| 5,312,719 A | 5/1994 | Schlosser et al. | |
| 5,330,796 A * | 7/1994 | Kasari et al. | 427/407.1 |
| 5,350,663 A | 9/1994 | Blum et al. | |
| 5,521,054 A * | 5/1996 | Takagi et al. | 430/331 |
| 5,578,420 A * | 11/1996 | Takagi et al. | 430/306 |
| 5,770,667 A * | 6/1998 | Epple et al. | 526/213 |
| 6,002,895 A * | 12/1999 | Kasuya et al. | 399/111 |
| 6,162,593 A * | 12/2000 | Wyatt et al. | 430/331 |
| 2002/0123600 A1* | 9/2002 | Van Den Berg et al. | 528/73 |
| 2003/0118946 A1 | 6/2003 | Wyatt et al. | |
| 2005/0153230 A1* | 7/2005 | Koyanagi et al. | 430/270.1 |
| 2005/0182171 A1* | 8/2005 | Bousseau et al. | 524/403 |
| 2008/0039355 A1 | 2/2008 | Katano et al. | |
| 2008/0167210 A1* | 7/2008 | Kaneda et al. | 510/176 |

FOREIGN PATENT DOCUMENTS

| | | | |
|---|---|---|---|
| EP | 1 097 923 A1 | | 5/2001 |
| JP | 61-2152 A | | 1/1986 |
| JP | 3-142821 A | | 6/1991 |
| JP | 04-182062 | * | 6/1992 |
| JP | 6-194847 A | | 7/1994 |
| JP | 9-263792 A | | 10/1997 |
| JP | 2000-273370 A | | 10/2000 |
| JP | 2001-226700 A | | 8/2001 |
| JP | 2006-85140 A | | 3/2006 |
| WO | WO 03/072634 | * | 9/2003 |

OTHER PUBLICATIONS

"Aromatic 150 Fluid Product Safety Summary", Exxon Mobil Chemical, Jun. 2009.*

* cited by examiner

*Primary Examiner* — Anca Eoff
(74) *Attorney, Agent, or Firm* — Sughrue Mion, PLLC

(57) ABSTRACT

A photosensitive composition remover used for removal of an uncured photosensitive composition, which remover comprises 1 to 80 percent by mass of at least one type of aromatic hydrocarbon having 9 carbon atoms or more within the molecule. The photosensitive composition remover further comprises an aprotic polar solvent and/or another solvent other than aprotic polar solvents. The photosensitive composition remover is effective for removal of an uncured photosensitive composition film deposited at the periphery, edges, or back of a substrate or removal of an uncured photosensitive composition deposited at the surface of system members or equipment in a process for forming a photosensitive composition film on a glass substrate, a semiconductor wafer, or the like. It is preferably used for removal of a photosensitive composition containing a pigment.

6 Claims, No Drawings

PHOTOSENSITIVE COMPOSITION REMOVER

CROSS REFERENCE TO RELATED APPLICATION

This application is an application filed under 35 U.S.C. §111(a) claiming benefit, pursuant to 35 U.S.C. §119(e)(1), of the filing date of Provisional Application No. 60/532,715 filed on Dec. 29, 2003, pursuant to 35 U.S.C. §111(b).

TECHNICAL FIELD

The present invention relates to a remover for the removal of an uncured photosensitive composition film at the periphery, edges, or back of a substrate or removal of an uncured photosensitive composition deposited at the surface of system members or equipment in a process for forming a photosensitive composition film on a glass substrate, semiconductor wafer, or the like.

More particularly, it relates to a remover for the removal of an uncured photosensitive composition film containing a pigment remaining at the periphery, edges, or back of a substrate or removal of an uncured photosensitive composition containing a pigment deposited at the surface of system members or equipment in a process for forming a photosensitive composition film on a substrate in the process of production of a liquid crystal or organic EL display.

BACKGROUND ART

In the process of production of a liquid crystal display, organic EL display, plasma display, or other flat panel display or a semiconductor, usually, patterns of a photosensitive composition are formed using photolithography.

As the methods of forming patterns of RGB or a resin black matrix in production of a color filter used for a liquid crystal or organic EL display, pigment dispersion, dyeing, printing, electrodeposition, and the like methods are used. Pigment dispersion is a method of patterning of colors by photolithography using photosensitive compositions containing pigments. As stable colored films are obtained, this method is suitable for production of a color filter. When using this method to form a photosensitive composition film on a substrate, there is a process of coating the substrate with a photosensitive composition containing a pigment. As the coating method, spin coating, slit coating, wire bar coating, roll coating, dip coating, spray coating, or a combination thereof or other methods are known.

In spin coating, the swelling parts of the photosensitive composition film at the periphery and edges of the substrate or the photosensitive composition deposited on the back of the substrate after coating the photosensitive composition is normally removed by rinsing by a photosensitive composition remover, that is, so-called edge rinsing or back rinsing. Further, in spin coating, in the process of removing the photosensitive composition splattering in a cup, that is, cup rinsing, as well, treatment is performed to remove the photosensitive composition by a photosensitive composition remover.

Further, as a process for coating a photosensitive composition in the production of a color filter, in addition to the above spin coating, there are coating of a photosensitive composition by slit coating, coating using a wire bar, and coating by a roll coater. In these methods as well, unnecessary photosensitive composition deposited on all or part of the slit nozzle, wire bar, or other parts of the coating system is removed after coating the photosensitive composition.

Further, in addition, sometimes the photosensitive composition deposited on members of the coating system, such as the system piping for transporting the photosensitive composition, is removed as well. Normally, for this removal of the photosensitive composition, a remover is used for cleaning.

In any of the processes for removal of a photosensitive composition deposited on a substrate or system, the remainder of the photosensitive composition component becomes a problem. With the photosensitive compositions containing pigments used for the production of a color filter, that is, the color resists used for formation of RGB or the black resist used for formation of a resin black matrix, the pigment components easily remain on the substrate or system surface. Even if these are slight, foreign matter may cause an increase in the defect rate in the production of color filters or a change in the color purity of the color filters or a drop in the contrast. There is growing demand for increasing the size and definition and lowering the cost of the substrates for the color filters used for color displays in recent years. In view of this situation, avoiding residual photosensitive composition components affecting the performance and yield of the color filters is becoming increasingly important.

In the past, as the remover for a photosensitive composition, a glycol ether or its ester or a mixture thereof has generally been used (for example, see Japanese Examined Patent Publication (Kokoku) No. 4-49938), but when applying this for cleaning off the above color resist, the removability of the resist is not sufficient, use of a large amount of remover becomes necessary, or incomplete removal results.

Further, for removal of a colored composition containing a pigment, there is also the method of using the solvent component used for the photosensitive composition or the component contained in the photosensitive composition such as a surfactant or dispersant (for example, see Japanese Unexamined Patent Publication (Kokai) No. 2000-273370), but when using only the solvent component contained in the photosensitive composition as a cleaner, the pigment easily precipitates and sufficient cleanability cannot be obtained. Further, when incorporating a surfactant, dispersant, or other component contained in the photosensitive composition in the cleaner composition, the component easily remains as a residue after evaporation on the substrate or system members, a further cleaning process becomes necessary, and use for removal of the photosensitive composition at the end faces and back of a substrate where remainder of a residue after evaporation is not preferred becomes impossible in practice.

DISCLOSURE OF INVENTION

The present invention provides a photosensitive composition remover superior in performance in removing a photosensitive composition.

In particular, it provides a remover effective for removal of a photosensitive composition film containing a pigment remaining at the periphery, edges, or back of a substrate or removal of a photosensitive composition containing a pigment deposited at the surface of system members or equipment in a process for forming a photosensitive composition film on a substrate in the process of production of a liquid crystal or organic EL display.

In the description of the present application, an "aromatic hydrocarbon having 9 carbon atoms or more within the molecule" is sometimes referred to as a "first component", an "aprotic polar solvent" is sometimes referred to as a "second component", and "other solvent other than aprotic polar solvents" is sometimes referred to as a "third component".

The inventors engaged in intensive research to solve the above problems. As a result, they discovered that by using a remover containing a specific aromatic hydrocarbon, the drop in the dispersability of a pigment when cleaning off a photosensitive composition containing a pigment can be suppressed and the removability can be improved and thereby reached the present invention.

The present invention is as follows:

(1) A photosensitive composition remover used for removal of an uncured photosensitive composition, which remover comprises 1 to 80 percent by mass of at least one type of aromatic hydrocarbon having 9 carbon atoms or more within the molecule.

(2) A photosensitive composition remover as set forth in (1), wherein the aromatic hydrocarbon having 9 carbon atoms or more within the molecule is an alkylbenzene having a boiling point of 150 to 250° C.

(3) A photosensitive composition remover as set forth in (1) or (2), having a composition selected from the group consisting of a composition of 20 to 80 percent by mass of one or more aromatic hydrocarbon(s) having 9 carbon atoms or more within the molecule and 20 to 80 percent by mass of one or more aprotic polar solvent(s) when the remover consists essentially of one or more aromatic hydrocarbon(s) having 9 carbon atoms or more within the molecule and one or more aprotic polar solvent(s);

a composition of 10 to 20 percent by mass of one or more aromatic hydrocarbon(s) having 9 carbon atoms or more within the molecule and 80 to 90 percent by mass of one or more other solvent(s) other than aprotic polar solvents when the remover consists essentially of one or more aromatic hydrocarbon(s) having 9 carbon atoms or more within the molecule and one or more other solvent(s) other than aprotic polar solvents; and a composition of 20 to 30 percent by mass of one or more aromatic hydrocarbon(s) having 9 carbon atoms or more within the molecule, 1 to 20 percent by mass of one or more aprotic polar solvent(s), and 55 to 70 percent by mass of one or more other solvent(s) other than aprotic polar solvents when the remover comprises one or more aromatic hydrocarbon(s) having 9 carbon atoms or more within the molecule, one or more aprotic polar solvent(s), and one or more other solvent(s) other than aprotic polar solvents.

(4) A photosensitive composition remover as set forth in any one of (1) to (3), having a composition selected from the group consisting of a composition of 20 to 40 percent by mass of one or more aromatic hydrocarbon(s) having 9 carbon atoms or more within the molecule and 60 to 80 percent by mass of one or more aprotic polar solvent(s) when the remover consists essentially of one or more aromatic hydrocarbon(s) having 9 carbon atoms or more within the molecule and one or more aprotic polar solvent(s);

a composition of 10 to 20 percent by mass of one or more aromatic hydrocarbon(s) having 9 carbon atoms or more within the molecule and 80 to 90 percent by mass of one or more other solvent(s) other than aprotic polar solvents, wherein the remover comprises 30 to 60 percent by mass of propylene glycol monomethyl ether, when the remover consists essentially of one or more aromatic hydrocarbon(s) having 9 carbon atoms or more within the molecule and one or more other solvent(s) other than aprotic polar solvents; and a composition of 20 to 30 percent by mass of one or more aromatic hydrocarbon(s) having 9 carbon atoms or more within the molecule, 3 to 20 percent by mass of one or more aprotic polar solvent(s), and 55 to 70 percent by mass of one or more other solvent(s) other than aprotic polar solvents, the aprotic polar solvent(s) being at least one selected from the group consisting of N,N-dimethylformamide and N,N-dimethylacetamide, and the other solvent(s) other than aprotic polar solvent(s) being at least one selected from the group consisting of propylene glycol monomethyl ether acetate, cyclohexanone, methyl 3-methoxypropionate and ethyl 3-ethoxypropionate, when the remover comprises one or more aromatic hydrocarbon(s) having 9 carbon atoms or more within the molecule, one or more aprotic polar solvent(s), and one or more other solvent(s) other than aprotic polar solvents.

(5) A photosensitive composition remover as set forth in claim 1 or 2, comprising 20 to 40 percent by mass of one or more aromatic hydrocarbon(s) having 9 carbon atoms or more within the molecule and 60 to 80 percent by mass of one or more aprotic polar solvent(s).

(6) A photosensitive composition remover as set forth in (1) or (2), comprising 10 to 20 percent by mass of one or more aromatic hydrocarbon(s) having 9 carbon atoms or more within the molecule and 80 to 90 percent by mass of one or more other solvent(s) other than aprotic polar solvents, wherein the remover comprises 30 to 60 percent by mass of propylene glycol monomethyl ether.

(7) A photosensitive composition remover as set forth in (1) or (2), comprising 20 to 30 percent by mass of one or more aromatic hydrocarbon(s) having 9 carbon atoms or more within the molecule, 3 to 20 percent by mass of one or more aprotic polar solvent(s), and 55 to 70 percent by mass of one or more other solvent other than aprotic polar solvents, wherein the aprotic polar solvent is at least one selected from the group consisting of N,N-dimethylformamide and N,N-dimethylacetamide, and the other solvent other than aprotic polar solvents is at least one selected from the group consisting of propylene glycol monomethyl ether acetate, cyclohexanone, methyl 3-methoxypropionate and ethyl 3-ethoxypropionate.

(8) A photosensitive composition remover as set forth in any one of (3) to (5), wherein the aprotic polar solvent is at least one selected from the group consisting of chain amide compounds, cyclic amide compounds, sulfur compounds, and cyclic esters.

(9) A photosensitive composition remover as set forth in any one of (3) to (5), wherein the aprotic polar solvent is at least one selected from the group consisting of formamide, N-methylformamide, N,N-dimethylformamide, N-ethylformamide, N,N-diethylformamide, N,N-dimethylacetamide, tetramethyl urea, N-methyl-2-pyrrolidone, N-methylimidazolidinone, dimethyl sulfoxide, sulfolane, and γ-butyrolactone.

(10) A photosensitive composition remover as set forth in (6), wherein the other solvent other than aprotic polar solvents is at least one selected from the group consisting of glycol ethers, glycol ether carboxylates, carboxylic acid esters, hydroxycarboxylic acid esters, ketones, alcohols, alkoxycarboxylic acids esters, and cyclic ethers.

(11) A photosensitive composition remover as set forth in any one of (1) to (10), used for removal of a photosensitive composition containing a pigment.

(12) A photosensitive composition remover as set forth in any one of (1) to (10), used for removal of an acrylic-type photosensitive composition containing a pigment.

The remover of the present invention is useful in that it exhibits an effect in removal of an uncured photosensitive composition film containing a pigment remaining at the periphery, edges, or back of a substrate or removal of an uncured photosensitive composition containing a pigment deposited at the surface of system members or equipment in a process for forming a photosensitive composition film on a substrate in the process of production of a liquid crystal or organic EL display.

BEST MODE FOR CARRYING OUT THE INVENTION

Below, the photosensitive composition remover of the present invention will be explained.

The photosensitive composition remover of the present invention (hereinafter referred to as the "remover") is used for removal of an uncured photosensitive composition. It comprises at least one type of aromatic hydrocarbon having 9 carbon atoms or more within the molecule. The ratio of content is 1 to 80 percent by mass.

The aromatic hydrocarbon having 9 carbon atoms or more within the molecule used in the present invention is an aromatic hydrocarbon substituted by one or more alkyl groups. Alkylbenzenes, alkylnaphthalenes, and the like may be mentioned. The alkyl group may be straight chained or branched. Two or more groups may be connected to form a cyclic structure. The number of carbon atoms of the aromatic hydrocarbon is at least nine, but is preferably not more than 12. Specific examples of an aromatic hydrocarbon having 9 carbon atoms or more within the molecule include, but are not limited to, 1,2,3-trimethylbenzene, 1,2,4-trimethylbenzene, 1,3,5-trimethylbenzene, 1-ethyl-2-methylbenzene, 1-ethyl-3-methylbenzene, 1-ethyl-4-methylbenzene, n-propylbenzene, cumene, n-butylbenzene, sec-butylbenzene, iso-butylbenzene, 1,2,3,4-tetramethylbenzene, 1,2,3,5-tetramethylbenzene, 1,2,4,5-tetramethylbenzene, 1,2-dimethyl-3-ethylbenzene, 1,2-dimethyl-4-ethylbenzene, 1,3-dimethyl-2-ethylbenzene, 1,3-dimethyl-4-ethylbenzene, 1,3-dimethyl-5-ethylbenzene, 1,4-dimethyl-2-ethylbenzene, 1-methyl-2-propylbenzene, 1-methyl-3-propylbenzene, 1-methyl-4-propylbenzene, 1-methyl-2-isopropylbenzene, 1-methyl-3-isopropylbenzene, 1-methyl-4-isopropylbenzene, 1,2-diethylbenzene, 1,3-diethylbenzene, 1,4-diethylbenzene, pentylbenzene, methylbutylbenzene, ethylpropylbenzene, dimethylpropylbenzene, methyldiethylbenzene, trimethylethylbenzene, pentamethylbenzene, hexylbenzene, methylpentylbenzene, ethylbutylbenzene, dimethylbutylbenzene, dipropylbenzene, methylethylpropylbenzene, trimethylpropylbenzene, triethylbenzene, dimethyldiethylbenzene, tetramethylethylbenzene, hexamethylbenzene, indane, tetrahydronaphthalene, or other alkylbenzenes and methylnaphthalene, dimethylnaphthalene, or other alkylnaphthalenes.

These aromatic hydrocarbons may be contained alone in the photosensitive composition remover or may be contained as combinations of two or more types of aromatic hydrocarbons.

Among these, alkylbenzenes having boiling points of 150 to 250° C. are preferred in the points of being high in performance in removing a photosensitive composition, in particular in performance in removing a photosensitive composition containing a pigment and further having drying characteristics suitable for removal of a photosensitive composition.

The particularly preferable alkylbenzenes among these are $C_9$ or $C_{10}$ alkylbenzenes. Specific examples thereof include 1,2,3-trimethylbenzene, 1,2,4-trimethylbenzene, 1,3,5-trimethylbenzene, 1-ethyl-2-methylbenzene, 1-ethyl-3-methylbenzene, 1-ethyl-4-methylbenzene, n-propylbenzene, cumene, n-butylbenzene, sec-butylbenzene, iso-butylbenzene, 1,2,3,4-tetramethylbenzene, 1,2,3,5-tetramethylbenzene, 1,2,4,5-tetramethylbenzene, 1,2-dimethyl-3-ethylbenzene, 1,2-dimethyl-4-ethylbenzene, 1,3-dimethyl-2-ethylbenzene, 1,3-dimethyl-4-ethylbenzene, 1,3-dimethyl-5-ethylbenzene, 1,4-dimethyl-2-ethylbenzene, 1-methyl-2-propylbenzene, 1-methyl-3-propylbenzene, 1-methyl-4-propylbenzene, 1-methyl-2-isopropylbenzene, 1-methyl-3-isopropylbenzene, 1-methyl-4-isopropylbenzene, 1,2-diethylbenzene, 1,3-diethylbenzene, and 1,4-diethylbenzene.

In actual use of the remover of the present invention, the aromatic hydrocarbon may be prepared by any method, but use of solvent naphtha with a high aromatic component ratio, for example, a basically $C_9$ alkylbenzene-based mixed solvent, is effective. A mixture of aromatic hydrocarbons, such as a basically $C_9$ alkylbenzene-based mixed solvent, a basically $C_{10}$ alkylbenzene-based mixed solvent, and a basically $C_{10}$ alkylbenzene-alkylnaphthalene-based mixed solvent, may be suitably used for the remover of the present invention. Specific examples of a basically $C_9$ alkylbenzene-based mixed solvent include Shellsol A (trademark; made by Shell Chemical, initial boiling point 160° C. and dry point 182° C.), Solvesso 100 (trademark; made by Exxon Chemical, initial boiling point 164° C. and dry point 176° C.), Swasol 1000 (trademark; made by Maruzen Petrochemical, initial boiling point 161° C. and dry point 179° C.), Ipsol 100 (trademark; made by Idemitsu Petrochemical, initial boiling point 162° C. and dry point 179° C.), Hisol 100 (trademark; made by Nippon Petrochemicals, initial boiling point 155° C. and dry point 180° C.), Solfine-TM (trademark; made by Showa Denko, initial boiling point 160° C. and dry point 180° C.). Specific examples of a basically $C_{10}$ alkylbenzene-based mixed solvent include Shellsol AB (trademark; made by Shell Chemical, initial boiling point 187° C. and dry point 213° C.), Solvesso 150 (trademark; made by Exxon Chemical, initial boiling point 188° C. and dry point 209° C.), Swasol 1500 (trademark; made by Maruzen Petrochemical, initial boiling point 180.5° C. and dry point 208.5° C.), Ipsol 150 (trademark; made by Idemitsu Petrochemical, initial boiling point 186° C. and dry point 205° C.), Hisol 150 (trademark; made by Nippon Petrochemicals, initial boiling point 182° C. and dry point 216° C.), Solfine-WZ (trademark; made by Showa Denko, initial boiling point 195 and dry point 250° C.). Specific examples of a basically $C_{10}$ alkylbenzene-alkylnaphthalene-based mixed solvent include Swasol 1800 (trademark; made by Maruzen Petrochemical, initial boiling point 195.5° C. and dry point 245° C.).

The remover of the present invention comprises 1 to 80 percent by mass, preferably 3 to 70 percent by mass, more preferably 5 to 60 percent by mass, even more preferably 10 to 40 percent by mass of the above aromatic hydrocarbon. If the content is not less than 1 percent by mass, the performance in removing the photosensitive composition, in particular the performance in dispersing and removing a pigment in a photosensitive composition containing a pigment, is exhibited. On the other hand, if not more than 80 percent by mass, the performance in dissolving the resin component contained in the photosensitive composition does not drop and as a result invites no drop in the performance in removing the photosensitive composition, so is preferred.

The remover of the present invention can comprise 1 to 80 percent by mass of an aprotic polar solvent. The aprotic polar solvent is a solvent with a low proton donor function. Specific examples of an aprotic polar solvent include formamide, N-methylformamide, N,N-dimethylformamide, N-ethylformamide, N,N-diethylformamide, N,N-dimethylacetamide, tetramethyl urea, and other chain amide compounds; N-methyl-2-pyrrolidone, N-methylimidazolidinone, and other cyclic amide compounds; dimethyl sulfoxide, sulfolane, and other sulfur compounds; and γ-butyrolactone and other cyclic esters.

Among these, N-methylformamide, N,N-dimethylformamide, N,N-dimethylacetamide, N-methyl-2-pyrrolidone, dimethyl sulfoxide, and γ-butyrolactone are preferable in the point of raising the ability to dissolve off the photosensitive composition. The aprotic polar solvent contained in the remover of the present invention may be contained alone or contained in a combination of two or more types.

When an aprotic polar solvent is contained, the content of the aprotic polar solvent is preferably 1 to 80 percent by mass, more preferably 3 to 80 percent by mass. If the content of the aprotic polar solvent is not more than 80 percent by mass, the drying characteristics after cleaning does not become poor. Further, with a photosensitive composition containing a pigment, the pigment does not precipitate, so this is preferred.

The remover of the present invention may also comprise one or more other solvent(s) other than aprotic polar solvents. That is, the remover of the present invention may also be any combination of a combination of one or more aromatic hydrocarbon(s) and one or more aprotic polar solvent(s), a combination of one or more aromatic hydrocarbon(s) and one or more other solvent(s) other than aprotic polar solvents, and a combination of one or more aromatic hydrocarbon(s), one or more aprotic polar solvent(s), and one or more other solvent(s) other than aprotic polar solvents.

Preferably, the remover of the present invention has a composition selected from the group consisting of a composition of 20 to 80 percent by mass of one or more aromatic hydrocarbon(s) having 9 carbon atoms or more within the molecule (hereinafter referred to as a first component) and 20 to 80 percent by mass of one or more aprotic polar solvent(s) (hereinafter referred to as a second component) when the remover consists essentially of a first component and a second component; a composition of 10 to 20 percent by mass of a first component and 80 to 90 percent by mass of one or more other solvent(s) other than aprotic polar solvents (hereinafter referred to as a third component) when the remover consists essentially of a first component and a third component; and a composition of 20 to 30 percent by mass of a first component, 1 to 20 percent by mass of a second component, and 55 to 70 percent by mass of a third component when the remover comprises a first component, a second component, and a third component.

More preferably, the remover of the present invention has a composition selected from the group consisting of a composition of 20 to 40 percent by mass of a first component and 60 to 80 percent by mass of a second component when the remover consists essentially of a first component and a second component; a composition of 10 to 20 percent by mass of a first component and 80 to 90 percent by mass of a third component, wherein the remover comprises 30 to 60 percent by mass of propylene glycol monomethyl ether which is one of other solvents other than aprotic polar solvents, when the remover consists essentially of a first component and a third component; and a composition of 20 to 30 percent by mass of a first component, 3 to 20 percent by mass of a second component, and 55 to 70 percent by mass of a third component, the second component being at least one selected from the group consisting of N,N-dimethylformamide and N,N-dimethylacetamide, and the third component being at least one selected from the group consisting of propylene glycol monomethyl ether acetate, cyclohexanone, methyl 3-methoxypropionate and ethyl 3-ethoxypropionate, when the remover comprises a first component, a second component, and a third component.

When the remover of the present invention consists essentially of a first component and a second component, it has a composition of 20 to 80 percent by mass of a first component and 20 to 80 percent by mass of a second component. Preferably, it has a composition of 20 to 40 percent by mass of a first component and 60 to 80 percent by mass of a second component. More preferably, it has a composition of 20 to 40 percent by mass of a first component and 60 to 80 percent by mass of a second component, and the first component is at least one selected from the group consisting of Solvesso 100 (trademark) and Solfine-TM (trademark), and the second component is at least one selected from the group consisting of γ-butyrolactone and N,N-dimethylacetamide.

When the remover of the present invention consists essentially of a first component and a third component, it has a composition of 10 to 20 percent by mass of a first component and 80 to 90 percent by mass of a third component. Preferably, it has a composition of 10 to 20 percent by mass of a first component and 80 to 90 percent by mass of a third component, and it comprises 30 to 60 percent by mass of propylene glycol monomethyl ether which is one of the third components. More preferably, it has a composition of 10 to 20 percent by mass of a first component and 80 to 90 percent by mass of a third component, it comprises 30 to 60 percent by mass of propylene glycol monomethyl ether, and the first component is at least one selected from the group consisting of 1,2,4-trimethylbenzene, cumene, Solvesso 100 (trademark) and Solfine-TM (trademark), and the third component comprises propylene glycol monomethyl ether and at least one selected from the group consisting of propylene glycol monomethyl ether acetate, cyclohexanone, butyl acetate and methyl 3-methoxypropionate.

When the remover of the present invention comprises a first component, a second component and a third component, it has a composition of 20 to 30 percent by mass of a first component, 1 to 20 percent by mass of a second component, and 55 to 70 percent by mass of a third component. Preferably, it has a composition of 20 to 30 percent by mass of a first component, 3 to 20 percent by mass of a second component, and 55 to 70 percent by mass of a third component. More preferably, it has a composition of 20 to 30 percent by mass of a first component, 3 to 20 percent by mass of a second component, and 55 to 70 percent by mass of a third component, the second component is at least one selected from the group consisting of N,N-dimethylformamide and N,N-dimethylacetamide, and the third component is at least one selected from the group consisting of propylene glycol monomethyl ether acetate, cyclohexanone, methyl 3-methoxypropionate and ethyl 3-ethoxypropionate. Even more preferably, it has a composition of 20 to 30 percent by mass of a first component, 3 to 20 percent by mass of a second component, and 55 to 70 percent by mass of a third component, and the first component is at least one selected from the group consisting of 1,2,4-trimethylbenzene, cumene, Solvesso 100 (trademark) and Solfine-TM (trademark), and the second component is at least one selected from the group consisting of N,N-dimethylformamide and N,N-dimethylacetamide, and the third component is at least one selected from the group consisting of propylene glycol monomethyl ether acetate, cyclohexanone, methyl 3-methoxypropionate and ethyl 3-ethoxypropionate.

Examples of other solvents other than aprotic polar solvents include glycol ethers, glycol ether carboxylates, carboxylic acid esters, hydroxycarboxylic acid esters, ketones, alcohols, alkoxycarboxylic acid esters, and cyclic ethers.

Specific examples thereof include ethylene glycol monomethyl ether, ethylene glycol monoethyl ether, ethylene glycol mono-n-propyl ether, ethylene glycol isopropyl ether, ethylene glycol mono-n-butyl ether, diethylene glycol monomethyl ether, diethylene glycol monoethyl ether, diethylene glycol monopropyl ether, diethylene glycol mono-n-butyl ether, ethylene glycol dimethyl ether, ethylene glycol diethyl ether, diethylene glycol dimethyl ether, diethylene glycol ethyl methyl ether, diethylene glycol diethyl ether, propylene glycol monomethyl ether, propylene glycol monoethyl ether, propylene glycol monopropyl ether, propylene glycol mono-n-butyl ether, dipropylene glycol monomethyl ether, dipropylene glycol dimethyl ether, tripropylene glycol monomethyl ether, and other glycol ethers; ethylene glycol monomethyl ether acetate, ethylene glycol monoethyl ether acetate, ethylene glycol monobutyl ether acetate, diethylene glycol monomethyl ether acetate, diethylene glycol monoethyl ether acetate, diethylene glycol monobutyl ether acetate, propylene glycol monomethyl ether acetate, and other glycol ether carboxylates; ethyl acetate, n-propyl acetate, isopropyl acetate, n-butyl acetate, sec-butyl acetate, isobutyl acetate, amyl acetate, hexyl acetate, cyclohexyl acetate, butyl propionate, amyl propionate, propyl butyrate, butyl butyrate, methyl benzoate, ethyl benzoate, dimethyl oxalate, diethyl oxalate, dimethyl succinate, dimethyl maleate, diethyl maleate, ethylene carbonate, propylene carbonate, and other carboxylic acid esters; methyl lactate, ethyl lactate, butyl lactate, methyl α-hydroxyisobutyrate, and other hydroxycarboxylic acid esters; acetone, methyl ethyl ketone, di-iso-butyl ketone, methyl iso-butyl ketone, methyl n-butyl ketone, di-iso-propyl ketone, methyl n-amyl ketone, methyl iso-amyl ketone, 3-methyl-2-hexanone, 4-methyl-2-hexanone, methyl n-hexyl ketone, methyl iso-hexyl ketone, 4-methyl-2-heptanone, 5-methyl-2-heptanone, 3-heptanone, 4-heptanone, 2,6-dimethyl-4-heptanone, cyclopentanone, cyclohexanone, and other ketones; butyl alcohol, n-amyl alcohol, iso-amyl alcohol, benzyl alcohol, cyclohexanol, furfuryl alcohol, and other alcohols; methyl 2-methoxyacetate, ethyl 2-ethoxyacetate, methyl 2-hydroxypropionate, ethyl 2-hydroxypropionate, ethyl 3-ethoxypropionate, methyl 3-methoxypropionate, ethyl 3-methoxy propionate, methyl 3-ethoxypropionate, propyl 2-hydroxypropionate, ethyl 2-methoxypropionate, propyl 2-ethoxypropionate, methyl 2-ethoxypropionate, ethyl 2-ethoxypropionate, methyl β-methoxyisobutyrate, and other alkoxycarboxylic acid esters; tetrahydrofuran, 1,3-dioxolane, 1,4-dioxane, and other cyclic ethers.

Among these other solvents other than aprotic polar solvents, glycol ethers, glycol ether carboxylates, carboxylic acid esters, alkoxycarboxylic acid esters, ketones, and alcohols raise the ability of cleaning off a photosensitive composition and give drying characteristics suitable for cleaning-off to the remover, and are preferable. Preferable specific examples thereof include propylene glycol monomethyl ether, dipropylene glycol monomethyl ether, propylene glycol monomethyl ether acetate, butyl acetate, ethyl 3-ethoxypropionate, methyl 3-ethoxypropionate, methyl 3-methoxypropionate, cyclohexanone, and n-butyl alcohol. More preferable specific examples thereof include propylene glycol monomethyl ether, propylene glycol monomethyl ether acetate, butyl acetate, ethyl 3-ethoxypropionate, methyl 3-methoxypropionate, and cyclohexanone. The other solvent other than aprotic polar solvents may also be used alone or in combinations of two or more types.

Next, the photosensitive composition to which the remover of the present invention is applied will be explained.

The photosensitive composition to which the remover of the present invention can be applied is normally a photosensitive composition used for production of various types of electronic parts such as a liquid crystal display or an organic EL display, and a semiconductor. In particular, the remover of the present invention is suitably used for cleaning off a photosensitive composition containing a pigment used for a liquid crystal display, an organic EL display, and the like. These photosensitive compositions generally comprise a film-forming substance developable by an alkali and a photosensitive substance. The photosensitive composition containing a pigment further comprises a pigment and a dispersant. Examples of a film-forming substance contained in the photosensitive composition include an acrylic-type resin, novolak-based resin, polyimide-based resin, polyvinyl phenol-based resin, and the like, but the present invention particularly can be suitably used for removal of a photosensitive composition containing an acrylic-type resin as a film-forming substance.

The remover of the present invention can be applied to removal of a photosensitive composition in the state coated to or deposited on an object to be cleaned. In particular, it is possible to be suitably used for removal of the photosensitive composition before photosensitization. The photosensitive composition may be in a state contained in a solvent or may be in a state after evaporation of the solvent.

As a method of removing the photosensitive composition, a method of removal by spraying the present remover from a nozzle or the like in a jet, droplet, or mist form on to an object to be cleaned on which a photosensitive composition is coated or deposited, a method of immersion of the object to be cleaned in the remover of the present invention, and the like may be mentioned. For efficient removal, it is also possible to make joint use of ultrasonic irradiation or physical cleaning by a brush or the like.

Another embodiment of the present invention is a substrate having a photosensitive composition film thereon obtained by removing an uncured photosensitive composition using the above-mentioned remover, which is used in the process of production of a liquid crystal display, an organic EL display, a semiconductor, or the like.

EXAMPLES

Below, examples will be given to explain the present invention but, of course, the present invention is not limited by these examples in any way.

Note that the cleanability was evaluated as being in the following three stages by visual observation of the state of dissolution of a photosensitive colored composition after immersion in a remover for 3 minutes.

G (good): Complete removal
F (fair): Partial dissolution
P (poor): Almost no dissolution Preparation Example 1

Preparation of Acrylic-Type Copolymer

A four-neck flask furnished with a dropping funnel, a thermometer, a condenser, and a stirrer was charged with 12.0 parts by mass of methacrylic acid (MA), 14.0 parts by mass of methyl methacrylate (MMA), 43.0 parts by mass of n-butyl methacrylate (BMA), 6.0 parts by mass of 2-hydroxyethyl acrylate (HEMA), and 225.0 parts by mass of ethyl cellosolve acetate (EGA). Air in the four-neck flask was substituted with nitrogen for 1 hour. Further, the content was warmed by an oil bath to 90° C., then a mixture of 12.0 parts by mass of MA, 14.0 parts by mass of MMA, 43.0 parts by mass of BMA, 6.0 parts by mass of HEMA, 225.0 parts by mass of EGA, and 3.2 parts by mass of 2,2'-azobisisobutyronitrile (AIBN) was added dropwise over 1 hour. This was allowed to polymerize for 3 hours, then a mixture of 1.0 parts by mass of AIBN and 15.0 parts by mass of EGA was further added and the content was further raised to 100° C., allowed to polymerize for 1.5 hours, then allowed to cool. The solids concentration of the acrylic-type copolymer obtained in this way was 22.1 percent by mass, the acid value was 92 mgKOH/g, and the mass-average molecular weight converted to polystyrene measured by GPC was 22,000.

Preparation Example 2

Preparation of Photosensitive Colored Composition
A: Black Photosensitive Colored Composition 30.0 parts by mass of the acrylic-type copolymer obtained in Preparation Example 1 (solids 6.6 parts by mass), 5.0 parts by mass of EGA, 3.3 parts by mass of Flowlen DOPA-33 (trademark; dispersant made by Kyoeisha Chemical, solid concentration 30 percent by mass), and 6.6 parts by mass of Special Black 4 (carbon black made by Degussa) were mixed, then allowed to stand over night. The mixture was stirred further for 1 hour, then passed four times through a triple roll mill (made by Kodaira Seisakusho, Type RIII-1RM-2). EGA was added to the obtained black ink to adjust the concentration to obtain a black colored composition having a solid concentration of 18.0 percent by mass.

To 100 parts by mass of the black colored composition obtained in this way, 4.4 parts by mass of dipentaerythritol hexaacrylate, 2.2 parts by mass of 2-(4-methoxyphenyl)-4,6-bis(trichloromethyl)-s-triazine, and 25 parts by mass of EGA were added and sufficiently stirred to obtain the photosensitive colored composition A.

Preparation Example 3

Preparation of Photosensitive Colored Composition
B: Green Photosensitive Colored Composition 30.0 parts by mass of the acrylic-type copolymer obtained in Preparation Example 1 (solids 6.6 parts by mass), 5.0 parts by mass of EGA, 3.3 parts by mass of Flowlen DOPA-33 (trademark; dispersant made by Kyoeisha Chemical, solid concentration 30 percent by mass), and 6.6 parts by mass of Pigment Green 36 were mixed, then allowed to stand over night. The mixture was stirred further for 1 hour, then passed four times through a triple roll mill (made by Kodaira Seisakusho, Type RIII-1RM-2). EGA was added to the obtained green ink to adjust the concentration to obtain a green colored composition having a solid concentration of 18.0 percent by mass.

To 100 parts by mass of the green colored composition obtained in this way, 4.4 parts by mass of dipentaerythritol hexaacrylate, 0.7 part by mass of 4,4'-bis(N,N-diethylamino) benzophenone, 2.3 parts by mass of 2,2'-bis(o-chlorophenyl)-4,4',5,5'-tetraphenyl-1,2'-biimidazole, 3.8 parts by mass of trimethylolpropane tristhiopropionate, and 42 parts by mass of EGA were added and sufficiently stirred to obtain the photosensitive colored composition B.

Preparation Example 4

Preparation of Photosensitive Colored Composition
C: Red Photosensitive Colored Composition 30.0 parts by mass of the acrylic-type copolymer obtained in Preparation Example 1 (solids 6.6 parts by mass), 5.0 parts by mass of EGA, 3.3 parts by mass of Flowlen DOPA-33 (trademark; dispersant made by Kyoeisha Chemical, solid concentration 30 percent by mass), and 6.6 parts by mass of Pigment Red 177 were mixed, then allowed to stand overnight. The mixture was stirred further for 1 hour, then passed four times through a triple roll mill (made by Kodaira Seisakusho, Type RIII-1RM-2). EGA was added to the obtained red ink to adjust the concentration to obtain a red colored composition having a solid concentration of 18.0 percent by mass.

To 100 parts by mass of the red colored composition obtained in this way, 4.4 parts by mass of dipentaerythritol hexaacrylate, 3.0 parts by mass of Irgacure 369 (made by Ciba Specialty Chemicals), 3.8 parts by mass of trimethyrol propane tristhiopropionate, and 42 parts by mass of EGA were added and sufficiently stirred to obtain the photosensitive colored composition C.

Preparation Example 5

Preparation of Photosensitive Colored Composition
D: Blue Photosensitive Colored Composition 30.0 parts by mass of the acrylic-type copolymer obtained in Preparation Example 1 (solids 6.6 parts by mass), 5.0 parts by mass of EGA, 3.3 parts by mass of Flowlen DOPA-33 (trademark; dispersant made by Kyoeisha Chemical, solid concentration 30 percent by mass), 6 parts by mass of Pigment Blue 15:6 and 0.6 parts by mass of Pigment Violet 23 were mixed, then allowed to stand over night. The mixture was stirred further for 1 hour, then passed four times through a triple roll mill (made by Kodaira Seisakusho, Type RIII-1RM-2). EGA was added to the obtained blue ink to adjust the concentration to obtain a blue colored composition having a solid concentration of 18.0 percent by mass.

To 100 parts by mass of the blue colored composition obtained in this way, 4.4 parts by mass of trimethyrol propane triacrylate, 3.0 parts by mass of 2-(4-aminophenyl)-4,6-bis (trichloromethyl)-s-triazine, 3.8 parts by mass of trimethyrol propane tristhiopropionate, and 42 parts by mass of EGA were added and sufficiently stirred to obtain the photosensitive colored composition D.

Example 1

One drop of each of the photosensitive colored composition A to photosensitive colored composition D prepared in Preparation Example 2 to Preparation Example 5 was dropped on a glass plate (28 mm×76 mm) which was then dried at room temperature for 24 hours.

This was immersed for 3 minutes in a remover comprised of 80 g of Solvesso 100 (trademark; made by Exxon Chemical, initial boiling point 164° C. and dry point 176° C.) and 20 g of N,N-dimethylformamide mixed together, allowed to stand, and had the photosensitive colored composition coated on its surface cleaned off. The results are shown in Table 1.

Examples 2 to 24 and Comparative Examples 1 to 5

The removers of the compositions shown in Table 1 were used to remove photosensitive colored compositions in the same way as in Example 1. The results are shown in Table 1.

TABLE 1

| | Remover composition (percent by mass) | | | | | | | | | | | | | | | Cleanability Photosensitive colored composition | | | |
|---|---|---|---|---|---|---|---|---|---|---|---|---|---|---|---|---|---|---|---|
| | Aromatic hydrocarbon | | | | | Aprotic polar solvent | | | | Other solvent | | | Other solvent | | | | | | |
| | MS | TMB | CUM | S-100 | S-TM | GBL | DMF | DMAC | DMSO | PMA | PM | CYA | BA | MMP | EEP | A(black) | B(green) | C(red) | D(blue) |
| Ex. 1 | | | | 80 | | 20 | | | | | | | | | | G | G | F | F |
| Ex. 2 | | | | | 30 | 1 | | | | 69 | | | | | | F | F | G | G |
| Ex. 3 | 80 | | | | | 20 | | | | | | | | | | G | G | G | F |
| Ex. 4 | | | | | 30 | | | | 1 | 69 | | | | | | G | F | G | G |
| Ex. 5 | | | | 40 | | 60 | | | | | | | | | | G | G | G | G |
| Ex. 6 | | | | | 40 | 60 | | | | | | | | | | G | G | G | G |
| Ex. 7 | | | | | 30 | | | 70 | | | | | | | | G | G | G | G |
| Ex. 8 | | | | | 20 | 80 | | | | | | | | | | G | G | G | G |
| Ex. 9 | | | | 20 | | | | | | 50 | 30 | | | | | G | G | G | G |
| Ex. 10 | | | | 20 | | | | | | 24 | 56 | | | | | G | G | G | G |
| Ex. 11 | | | | 20 | | | | | | | 48 | | 32 | | | G | G | G | G |
| Ex. 12 | | | | 20 | | | | | | | 40 | 40 | | | | G | G | G | G |
| Ex. 13 | | 10 | 10 | | | | | | | | 40 | 40 | | | | G | G | G | G |
| Ex. 14 | | | | 10 | | | | | | | 40 | | | 50 | | G | G | G | G |
| Ex. 15 | | | | | 30 | | 3 | | | 67 | | | | | | G | G | G | G |
| Ex. 16 | | | | | 30 | | 10 | | | | | 60 | | | | G | G | G | G |
| Ex. 17 | | | | | 30 | | 15 | | | 55 | | | | | | G | G | G | G |
| Ex. 18 | | | | | 30 | | 15 | | | 55 | | | | | | G | G | G | G |
| Ex. 19 | | 20 | | | | | 20 | | | | | 60 | | | | G | G | G | G |
| Ex. 20 | | | 20 | | | | 20 | | | 60 | | | | | | G | G | G | G |
| Ex. 21 | | | | | 30 | | 3 | | | | | 67 | | | | G | G | G | G |
| Ex. 22 | | 30 | | | | | 5 | | | 65 | | | | | | G | G | G | G |
| Ex. 23 | | | | | 30 | | 5 | | | | | | | 65 | | G | G | G | G |
| Ex. 24 | | | | | | 20 | 10 | | | | | | | | 70 | G | G | G | G |
| Comp. Ex. 1 | | | 100 | | | | | | | | | | | | | P | P | P | P |
| Comp. Ex. 2 | | | | | | | | | | 70 | 30 | | | | | | | | |
| Comp. Ex. 3 | | | | | | | | | | | | 100 | | | | | | | |
| Comp. Ex. 4 | | | | | | | | | | | | | | | | | | | |
| Comp. Ex. 5 | 90 | | | | | | 10 | | | | | | | | | | | | |

TABLE 1-continued

| | | | | | |
|---|---|---|---|---|---|
| Comp. Ex. 2 | | F | F | F | F |
| Comp. Ex. 3 | | F | P | F | F |
| Comp. Ex. 4 | 100 | P | P | P | P |
| Comp. Ex. 5 | | P | P | P | P |

Abbreviations
MS 1,3,5-trimethylbenzene
TMB 1,2,4-trimethylbenzene
CUM Cumene
S-100 Solvesso 100 (trademark; made by Exxon Chemical)
S-TM Solfine-TM (trademark; made by Showa Denko)
DMF N,N-dimethylformamide
DMAC N,N-dimethylacetamide
DMSO Dimethyl sulfoxide
GBL γ-butyrolactone
PMA Propylene glycol monomethyl ether acetate
PM Propylene glycol monomethyl ether
CYA Cyclohexanone
BA Butyl acetate
MMP Methyl 3-methoxypropionate
EEP Ethyl 3-ethoxypropionate

INDUSTRIAL APPLICABILITY

The remover of the present invention may be used for removal of an unnecessary uncured photosensitive composition deposited at the periphery, edges, or back of a substrate or removal of unnecessary uncured photosensitive composition deposited at all or part of a coating system in a process for coating a photosensitive composition for production of a liquid crystal display, an organic EL display, or a semiconductor.

In particular, it is preferably used in the process of coating a photosensitive composition containing a pigment in the process of production of a color filter used for a liquid crystal display or an organic EL display.

The remover of the present invention may also be preferably used as a so-called edge rinse or back rinse rinsing agent for removal of the uncured photosensitive composition of the periphery, edges, or back of the substrate when coating a photosensitive composition on a substrate by spin coating or a so-called cup rinse for cleaning off a photosensitive composition splattered in a cup at the time of spin coating.

Slit coating, wire bar coating, roll coating, and the like are known as methods of coating a photosensitive composition on a substrate other than spin coating. The remover of the present invention is suitably used for removal of the uncured photosensitive composition deposited on a slit nozzle, wire bar, printing plate, or other surface of members or equipment of coating systems as well.

The invention claimed is:

1. A photosensitive composition remover used for removal of an uncured photosensitive composition, which remover consists essentially of 10 to 20 percent by mass of one or more aromatic hydrocarbon(s) having 9 carbon atoms or more within the molecule and 80 to 90 percent by mass of one or more other solvent(s) other than aprotic polar solvents,
wherein the aromatic hydrocarbon is basically $C_9$ or $C_{10}$-based,
wherein the photosensitive composition remover is used for removal of a photosensitive composition containing a pigment;
wherein the other solvent other than aprotic polar solvents is two or more of propylene glycol monomethyl ether, propylene glycol monomethyl ether acetate, butyl acetate, ethyl 3-ethoxypropionate, methyl 3-methoxypropionate, and cyclohexanone;
wherein 30 to 60 percent by mass of propylene glycol monomethyl ether is present in the remover;
wherein the aromatic hydrocarbon which is basically $C_9$ or $C_{10}$-based comprises a solvent naphtha.

2. A photosensitive composition remover used for removal of an uncured photosensitive composition, which remover consists essentially of 10 to 20 percent by mass of one or more aromatic hydrocarbon(s) having 9 carbon atoms or more within the molecule and 80 to 90 percent by mass of one or more other solvent(s) other than aprotic polar solvents,
wherein the aromatic hydrocarbon is basically $C_9$ or $C_{10}$-based,
wherein the photosensitive composition remover is used for removal of a photosensitive composition containing a pigment;
wherein the other solvent other than aprotic polar solvents is at least one selected from the group consisting of glycol ethers excluding dipropylene glycol monomethyl ether, glycol ether carboxylates, carboxylic acid esters excluding ethyl acetate and amyl acetate, hydroxycarboxylic acid esters ketones alkoxycarboxylic acids esters, and cyclic ethers; and
wherein the aromatic hydrocarbon which is basically $C_9$ or $C_{10}$-based comprises at least one selected from the group consisting of a basically $C_9$ alkylbenzene-based mixed solvent, a basically $C_{10}$ alkylbenzene-based mixed solvent, and a basically $C_{10}$ alkylbenzene-alkylnaphthalene-based mixed solvent,
wherein 30 to 60 percent by mass of propylene glycol monomethyl ether is present in the remover.

3. A photosensitive composition remover as set forth in claim 2, wherein the other solvent other than aprotic polar solvents other than propylene glycol monomethyl ether is at least one selected from the group consisting of propylene glycol monomethyl ether acetate, butyl acetate, cyclohexanone, methyl 3-methoxypropionate and ethyl 3-ethoxypropionate.

4. A photosensitive composition remover used for removal of an uncured photosensitive composition, which remover consists essentially of 10 to 20 percent by mass of one or more aromatic hydrocarbon(s) having 9 carbon atoms or more within the molecule and 80 to 90 percent by mass of one or more other solvent(s) other than aprotic polar solvents,
wherein the aromatic hydrocarbon is basically $C_9$ or $C_{10}$-based,
wherein the photosensitive composition remover is used for removal of a photosensitive composition containing a pigment;

wherein the other solvent other than aprotic polar solvents comprises a glycol monoalkyl ether and at least one selected from the group consisting of glycol ether carboxylates, carboxylic acid esters, hydroxycarboxylic acid esters, ketones, alkoxycarboxylic acids esters, and cyclic ethers; and wherein the aromatic hydrocarbon which is basically $C_9$ or $C_{10}$-based comprises at least one selected from the group consisting of a basically $C_9$ alkylbenzene-based mixed solvent, a basically $C_{10}$ alkylbenzene-based mixed solvent, and a basically $C_{10}$ alkylbenzene-alkylnaphthalene-based mixed solvent.

5. A photosensitive composition remover used for removal of an uncured photosensitive composition, which remover comprises 10 to 20 percent by mass of at least one type of aromatic hydrocarbon having 9 carbon atoms or more within the molecule and 80 to 90 percent by mass of one or more other solvent(s) other than aprotic polar solvents, wherein the at least one type of aromatic hydrocarbon having 9 carbon atoms or more within the molecule comprises at least one selected from the group consisting of a basically $C_9$ alkylbenzene-based mixed solvent, a basically $C_{10}$ alkylbenzene-based mixed solvent, and a basically $C_{10}$ alkylbenzene-alkylnaphthalene-based mixed solvent, wherein the remover comprises 30 to 60 percent by mass of propylene glycol monomethyl ether.

6. A photosensitive composition remover as set forth in claim 5, wherein the other solvent other than aprotic polar solvents other than propylene glycol monomethyl ether is at least one selected from the group consisting of glycol ethers, glycol ether carboxylates, carboxylic acid esters, hydroxycarboxylic acid esters, ketones, alcohols, alkoxycarboxylic acids esters, and cyclic ethers.

\* \* \* \* \*